(12) United States Patent
Roach et al.

(10) Patent No.: US 6,560,398 B1
(45) Date of Patent: May 6, 2003

(54) LIGHT-EMITTING FIBER, AND METHOD FOR MAKING SAME

(75) Inventors: William R. Roach, Rocky Hill, NJ (US); Daniel J. Szostak, Hamilton Square, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/691,882

(22) Filed: Oct. 19, 2000

Related U.S. Application Data
(60) Provisional application No. 60/182,156, filed on Feb. 14, 2000.

(51) Int. Cl.[7] ................................................. G02B 6/00
(52) U.S. Cl. ....................... 385/147; 385/123; 385/131; 385/901
(58) Field of Search .................................. 385/123, 147, 385/131, 901; 313/483, 500, 498, 503; 204/192.1

(56) References Cited

U.S. PATENT DOCUMENTS

| | | |
|---|---|---|
| 3,701,924 A | 10/1972 | Glaser |
| 4,782,336 A | 11/1988 | Bailey |
| 4,952,031 A | 8/1990 | Tsunoda |
| 5,106,181 A | 4/1992 | Rockwell, III |
| 5,300,862 A | 4/1994 | Parker et al. |
| 5,302,468 A | 4/1994 | Namiki et al. |
| 5,596,671 A | 1/1997 | Rockwell, III |
| 5,767,824 A | 6/1998 | Jacobsen |
| 6,078,138 A | 6/2000 | Iketsu |
| 6,228,228 B1 * | 5/2001 | Singh et al. ............. 204/191.1 |
| 6,259,846 B1 * | 7/2001 | Roach et al. ................ 385/123 |
| 6,274,978 B1 * | 8/2001 | Roach et al. ................ 313/483 |

FOREIGN PATENT DOCUMENTS

| | | |
|---|---|---|
| EP | 0 537 529 A | 9/1992 |
| JP | 09230802 | 9/1997 |
| WO | WO 00/51402 | 8/2000 |

OTHER PUBLICATIONS

International Search Report, PCT/US01/04815, Aug. 29, 2001, 3 Pages.

"Flexible, Fiber–Based, Larger–Area, Flat Pane Display Technology", Technical and Management Proposal #99=13000–1–095, vol. 1 Mar. 26, 1999 (Business and Financial Data Redacted).

Fred Weissortel, et al. "Spiros, Spiro–Spiros and Other Novel Amorphous Material for Blue Electroluminescence", Extended Abstracts, the Fourth International Conference on the Science and Technology of Display Phosphors, Sep. 14–17, 1998.

D.F. O'Brian, et al, Efficient Saturated Red Emission from a Phosphorescent Doped Organic Light Emitting Device, Extended Abstracts, the Fourth International Conference on the Science and Technology of Display Phosphors, Sep. 14–17, 1998.

(List continued on next page.)

*Primary Examiner*—Ellen E. Kim
(74) *Attorney, Agent, or Firm*—William J. Burke (57) ABSTRACT

A light-emitting fiber comprises an optical fiber having a number of light-emitting elements disposed along the length of one surface thereof. The light-emitting elements include a segmented hole injecting electrode on which an electroluminescent material, such as an OLED material, is disposed and an electron injecting electrode overlying the OLED layer. The segmented hole injecting electrodes are connected together by an electrical conductor disposed on a side surface of the optical fiber. Electrical contacts connect to the electron injecting electrode and are disposed, at least in part, so as to not overlie the OLED layer. The electrodes, OLED material and contacts are deposited on the optical fibers by mask deposition, preferably utilizing masks adapted to contemporaneously process a plurality of fibers.

30 Claims, 7 Drawing Sheets

OTHER PUBLICATIONS

E.W. Forsythe, et al, Interface Analysis of Naththyl–Substituted Benzidine Derivative and Tris–8–(Hydroxyquinoline) Aluminum Using Ultraviolet and X–Ray Protoemission Spectroscopy, Extented Abstracts, the Fourth International Conference on the Science and Technology of Display Phosphors, Sep. 14–17, 1998.

Y. Sato, et al, Red Emitting Organic El Devices with Novel Dopants, Extended Abstracts, the Fourth International Conference on the Science and Technology of Display Phosphors, Sep. 14–17, 1998.

SID (Society for Information Display International Symposium Digest of Technical Papers) vol. XXX, May 18–20, 1999, Invited paper: Organic LED–Full–Color Passive–Matrix Display. Y. Fukuda, et al, pp 430–433.

J.H. Burroughes, "High Efficiency Polymer Light Emitting Diodes", Extended Abstracts, the Fourth International Conference on the Science and Technology of Display Phosphors, Sep. 14–17, 1998.

S. Forrest, et al, "The Dawn of Organic Electronics", Organic Semiconductors are Strong Candidates for Creating Flexible, Full–Color Displays and Circuits on Plastic, IEEE Spectrum, Aug. 2000, pp 29–34.

* cited by examiner

LIGHT-EMITTING FIBER, AND METHOD FOR MAKING SAME

This Application claims the benefit of U.S. Provisional Application Serial No. 60/182,156 filed Feb. 14, 2000.

The present invention relates to a light-emitting fiber and, in particular, to a long light-emitting fiber and a method for making same.

It has long been desired that electronic displays be made with larger screen sizes and also be very thin, ultimately reaching a configuration that may be hung on a wall. Inherent physical limitations preclude conventional cathode ray tubes, such as the color picture tubes and display tubes utilized in televisions, computer displays, monitors and the like, from achieving such desired result. While plasma displays have been proposed to satisfy such desire, the large glass vacuum envelope they require is difficult to manufacture, and thus is expensive, which is not desirable.

The entire display screen of such plasma devices must be fabricated as a single piece and must reproduce many thousands of pixels. Any significant defect that results in faulty pixels or in a non-uniform brightness across the screen, even if confined to a relatively small area, renders the entire screen defective. Such defects cannot be tested or detected until the entire screen is processed, and are either not susceptible of repair or are very expensive to repair, thereby substantially reducing the yield and increasing the cost of each satisfactory plasma display.

One attractive approach for producing a large, thin display screen is to provide an array of a large number of adjacent light-emitting fibers. An advantage of such light-emitting fiber display is that each fiber is relatively inexpensive and may be separately tested before assembly into a display. Because defective fibers are detected and discarded before assembly into a display, the yield of a display which is made from known good light-emitting fibers is increased and the cost thereof is reduced. One such fiber display is described in U.S. Pat. No. 6,274,978 entitled "FIBER-BASED FLAT PANEL DISPLAY" (U.S. patent application Ser. No. 09/418,454 filed Oct. 15, 1999).

With regard to such fiber-based displays, it is desirable that light-emitting fibers therefor be available that can be fabricated in a variety of ways, such as for improving performance, enhancing processing, enabling testing, facilitating assembly of fibers into a display, and/or reducing cost.

Accordingly, there is a need for a light-emitting fiber that is fabricated in a way that tends to improve the useful life of the light-emitting elements and/or to facilitate assembly of fibers into a display.

To this end, the light-emitting fiber of the present invention comprises a length of a fiber of an optically transparent material, a first electrode including a plurality of electrode segments disposed along the length of a first surface of the fiber, wherein said electrode segments include a layer of an optically-transparent electrically conductive material, and an elongated electrical conductor disposed along the length of the fiber on a second surface thereof that is contiguous to the first surface thereof, wherein the elongated electrical conductor is in electrical contact with each of the electrode segments along the length of the fiber. A light-emitting material is disposed on the plurality of electrode segments, and a plurality of electrical contacts are disposed in one-to-one relation to the electrode segments on the light-emitting material along the length of the fiber, wherein the light-emitting material disposed between a given one of the electrode segments and a corresponding one of the electrical contacts emits light responsive to an electrical signal applied between the elongated electrical conductor and the corresponding one electrical contact.

According to another aspect of the invention, a method for making a light-emitting fiber having a plurality of light-emitting elements thereon comprises:

providing a length of optical fiber;

depositing a plurality of spaced-apart first electrode segments along the length of optical fiber;

depositing an electrical conductor along a side of the length of optical fiber and in electrical contact with the plurality of spaced-apart first electrode segments;

depositing a layer of a light-emitting material on the first electrode segments along the optical fiber; and depositing a plurality of electrical contacts on the light-emitting material and extending to overlie spaces between adjacent ones of the spaced-apart first electrode segments.

BRIEF DESCRIPTION OF THE DRAWING

The detailed description of the preferred embodiments of the present invention will be more easily and better understood when read in conjunction with the FIGURES of the Drawing which include.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. For example, a particular element may be designated as "xx" in one figure, by "1xx" in another figure, by "2xx" in another figure, and so on. It is noted that, according to common practice, the various features of the drawing are not to scale, and the dimensions of the various features are arbitrarily expanded or reduced for clarity.

DESCRIPTION OF THE PREFERRED EMBODIMENT

Figure 1A:
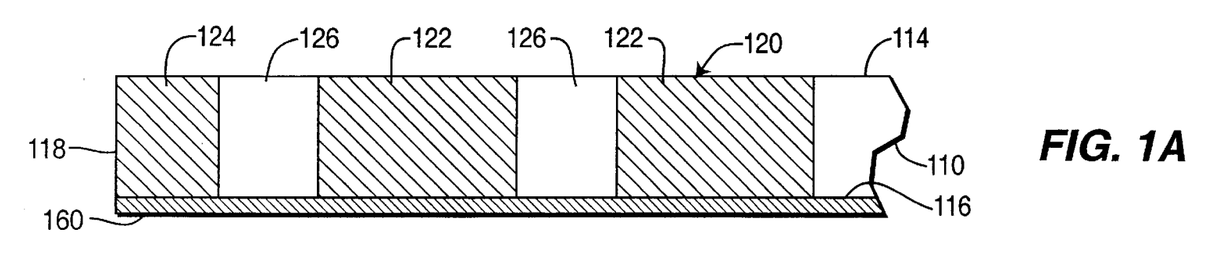
FIGS. 1A, 1B and 1C are a sequence of schematic diagrams of a top view of portion of an exemplary embodiment of a light emitting fiber illustrating the fabrication and arrangement thereof.
Figure 1B:
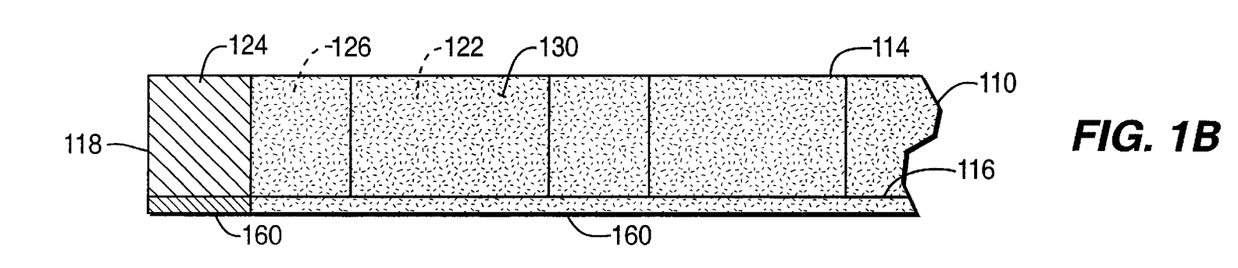
Figure 1C:
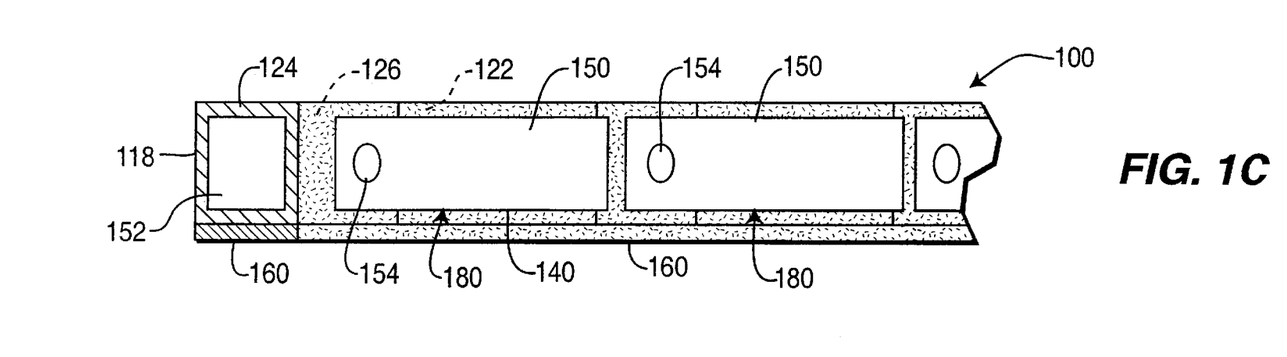

FIGS. 1A, 1B and 1C are a sequence of schematic diagrams of a top view of an exemplary embodiment of a light-emitting fiber 100 illustrating the fabrication and arrangement thereof. A plurality of such fibers 100 are arrayed in side-by-side array, preferably being substantially contiguous, and are connected to appropriate electrical driver circuits for selectively and controllably energizing each light-emitting element (pixel) to produce a display for displaying information. Image and/or information are used interchangeably with respect to what is displayed on a display device, and are intended to encompass any and all of the wide variety of displays that a user may desire, including, but not limited to, visual images and pictures, whether still or moving, whether generated by a camera, computer or any other source, whether true, representative or abstract or arbitrary, whether or not including symbols or characters such as alphanumeric characters or mathematical notations, whether displayed in black and white, monochrome, polychrome or full color.

Light-emitting fiber 100 is fabricated on a ribbon or fiber 110 of conventional optically transmissive material, such as glass, borosilicate glass, soda-lime glass, quartz, sapphire, plastic, polymethyl-methacrylate (PMMA), polycarbonate, acrylic, Mylar, polyester, polyimide or other suitable material, to have along its length on one of its surfaces 112 (e.g., a top surface 112) a plurality of light-emitting elements 180. Light-emitting elements 180 include an electro-luminescent material, preferably an Organic Light-Emitting Diode (OLED) material, disposed between suitable electrodes. A quartz fiber may be preferred if chemical inertness is desired, and a plastic fiber may be preferred if greater flexibility is desired. Such ribbon or fiber is generally referred to herein as an optical fiber, it being understood that the material and physical size and shape of such ribbon or fiber may vary.

Each light-emitting element or OLED "stack" 180 includes at least a hole injecting electrode 122, a layer of light-emitting material 130 and an electron injector electrode 140, and is independently operable to produce one pixel of the image or information to be displayed. Alternatively light emission can occur in the electron (or hole) transport material in a region near the boundary with the hole (or electron) transport layer. In a color display, three physical pixel elements 180 may each produce one of three color sub-pixels that emit light of three different colors to together produce one color pixel of a color image.

FIG. 1A shows a segmented electrode layer 120 on top surface 112 of optical fiber 110, such as by depositing a conductive layer 120 such as indium tin oxide (ITO), tin oxide, zinc oxide, combinations thereof, or another transparent hole-injecting material. Only a portion of light-emitting fiber 100 is shown in FIGS. 1A–1C. Each segment of ITO layer 120 serves as the hole injecting electrode 122 of OLED light-emitting element or stack 180. The spaces 126 between adjacent ITO electrodes 122 are of sufficient dimension along the length of fiber 110 for receiving an electrical contact 154 thereon for applying a data signal to light-emitting element 180, as described below.

An electrically conductive bus 160, preferably of a highly conductive metal such as aluminum, copper, gold, chromium/gold (Cr Au) or silver, is deposited on or attached to one side 116 of optical fiber 110 and slightly overlaps the ITO either on top surface 112 or on side surface 116 to make electrical contact to each ITO electrode 122 thereon for connecting the hole injecting electrode 122 of each light-emitting element 180 to a select input electrode 124 at one or both ends 118 of optical fiber 110. Electrical bus 160, which couples a select drive signal to the ITO electrodes 122 of each light-emitting element 180 along the length of optical fiber 110, is covered by an insulating layer 170 (not shown in FIG. 1A).

Next, a layer 130 of OLED material is deposited on segmented electrodes 122, which OLED layer 130 may or may not be segmented, and need not be segmented. In the simplest form for fabrication, OLED layer 130 is continuous, as illustrated in FIG. 1B. OLED layer or stack 130 does not overlie end ITO electrode 124. OLED stack 130 typically includes of several different layers of material, each typically having a thickness of about 500 Å. A segmented layer 140 of electron injecting material is deposited over OLED layer 130, typically through the same mask that is utilized for deposition of the OLED hole transport and electron transport layers, and a relatively durable conductive segmented contact layer 150 is likewise deposited onto segmented electrode layer 140 with the segments of layers 140 and 150 in registration. The aligned segment breaks of electrode layer 140 and contact layer 150 overlie spaces 126 of ITO layer 120 close to an edge of each ITO electrode 122. The segments of ITO layer 120 and of electron injecting/contact layers 140, 150 are thus of like pitch along the length of optical fiber 110 but are offset so that each segment of contact layer 150 overlies one ITO electrode 122 and provides a contact 154 to electrode 140 overlying the space 126 adjacent to the same one ITO electrode 122. Top electrode 140 may be a layer of magnesium, magnesium/silver, calcium, calcium/aluminum, lithium fluoride or lithium fluoride/aluminum, or any other stable electron injector. Contact layer 150 may be aluminum, gold, chromium/gold (Cr Au) or copper, for example, or any other durable high-conductivity material. Top electrodes 140 and contacts 150 are in one-to-one correspondence with one another and with ITO contacts 120 along the length of optical fiber 110.

Contacts 154 are durable and provide a durable contact structure to which conductors providing pixel data signals are connected, which data signal conductors lie transverse to the length direction of light-emitting fibers 100 in an array of a display. Because there is no ITO electrode under the contact 154 portion of contact layer, the connecting of such transversely oriented data signal conductors to such contact 154 cannot cause a short circuit through or damage to OLED layer 130 between the hole injecting electrode 122 and the electron injecting electrode 140 of any light-emitting element 180. The deposition of contact layer 150 also produces a contact 152 at the end 118 of optical fiber 110 connecting directly to ITO end electrode 124 (there is no OLED layer 130 or insulator material overlying ITO electrode 124) and electrical bus 160 at the end 118 of optical fiber 110 to provide a durable contact structure to which conductors providing pixel select signals are connected.

Thus, suitable electrical connections can be made to couple the select signal and the data signal to respective electrodes 122 and 140 of each light-emitting element 180 for controllably and selectively energizing each light-emitting element 180 to produce the pixels of an image to be displayed by a display including a plurality of light-emitting fibers 100 in parallel side-by-side array. These connections are made to the surface of the light-emitting fibers 100 on which the light-emitting elements are formed, and the light emitted thereby passes through the optical fiber 110 away from the light-emitting elements 180 to be observed by a viewer of such display. It is noted that because light-emitting fibers 100 may be of any desired length, and because any desired number of such fibers 100 may arrayed side-by-side, a thin panel display of virtually any desired size (height and width) may be assembled utilizing the present invention.

Particularly in large displays, the lengths of select conductor 160 may become long and the resistance of a thin-film or other deposited conductor 160 may be higher than desired. Conductor 160 may be made thicker than the thicknesses obtainable by deposition of metals, such as by attaching thin strips of metal foil (e.g., 25–50 $\mu$m thick) along the length of fiber 100 and connected to each one of the ITO segments 122 by a spot of electrically-conductive epoxy or adhesive. Such strips 160 may be of aluminum, copper, silver, gold or other suitable metal, and may be in place of or in addition to the deposited strips 160. Where a metal foil strip 160 is employed in addition to a deposited conductor 160, the metal foil strip may be attached to deposited conductor 160 by electrically-conductive epoxy or adhesive, or may be simply be compressed against deposited conductor 160 by the (insulated) side of an adjacent fiber 100.

Figure 2A:
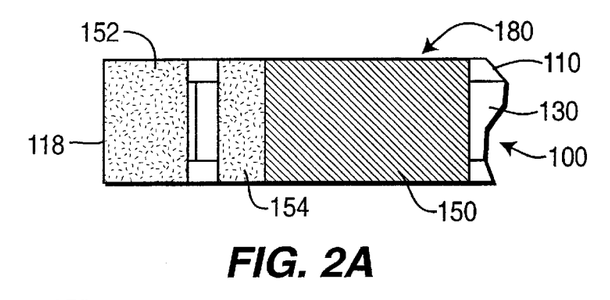
FIGS. 2A, 2B and 2C are schematic diagrams of a top view, side view and bottom view, respectively, of the exemplary light emitting fiber portion of FIGS. 1A–1C.
Figure 2B:
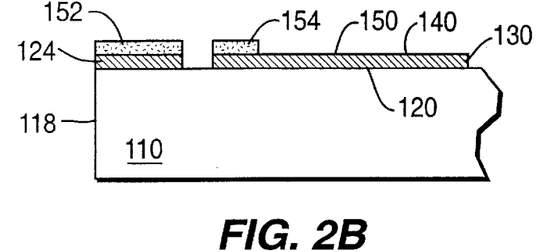
Figure 2C:
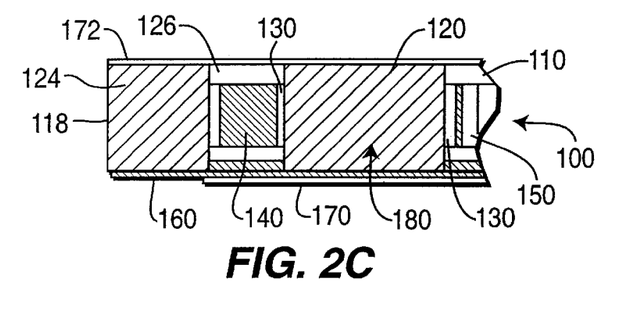
Figure 3:
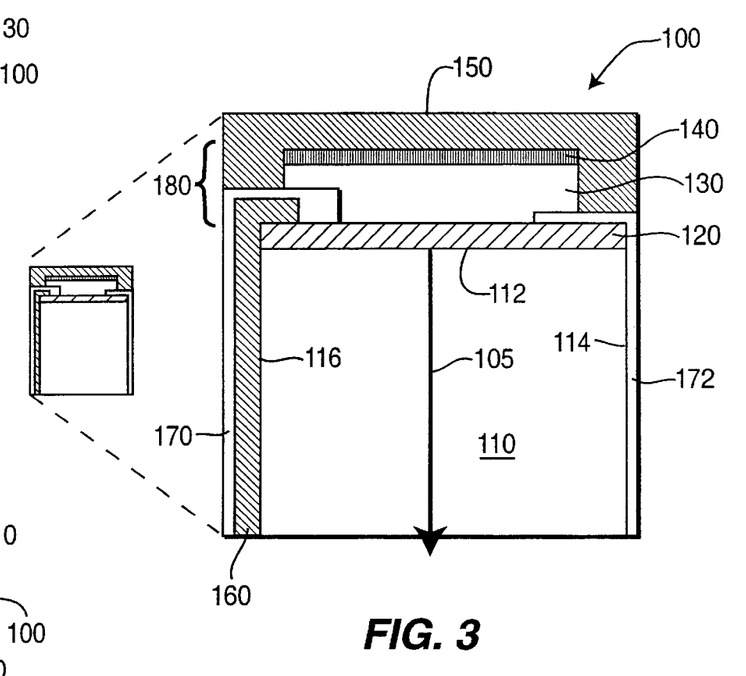
FIG. 3 is a schematic cross-sectional diagram of the exemplary light emitting fiber portion of FIGS. 1A–1C and 2A–2C.

FIGS. 2A, 2B and 2C are schematic diagrams of a top view, side view and bottom view, respectively, of the exemplary light emitting fiber 100 and are better understood when considered in relation to FIG. 3 which is a schematic cross-sectional diagram of the exemplary light emitting fiber 100. FIGS. 2A–2C and 3 illustrate an arrangement of the layers of light-emitting fiber 100 that provides passivation of the OLED light-emitting elements 180 and, differs from the arrangement of FIGS. 1A–1C in that OLED layer 130 is segmented and insulating layers 170, 172 cover both edges of ITO layer 120. Insulating layers 170, 172 enable the edge of the OLED layer 130 segments to be on the insulators 170, 172 rather than extending to the edges of fiber 110. As a result, contact layer 150 can completely enclose OLED layer segments 130.

Passivation, which prevents or reduces moisture from reaching the OLED light-emitting elements 180 while not interfering with the making of electrical connection thereto, furthers achieving long life and high performance of the OLED light-emitting elements 180. In FIG. 2C, the electrode structure of light-emitting fiber 100 is visible, at least in part, through transparent optical fiber 110. Suitable moisture barrier materials include silicon nitride, silicon dioxide, silicon oxynitride, silicon carbide, diamond-like carbon, and phosphorus-silicate glass. Portions of electrode 140 that would be in spaces 126 are not needed for operability and may be eliminated with the expectation of improving the durability of contacts 154.

Contact layer 150 preferably extends beyond the width of OLED layer 130 (visible in FIG. 2A) to provide a metal layer 150 surrounding OLED layer 130. To prevent contact layer 150 from electrically shorting to ITO layer 120 or to electrical bus 160, insulation layer 170 covers electrical select bus 160 on side 116 of optical fiber 110 and insulation layer 172 covers side 114 and the edge of ITO layer 120 proximal side 114 of fiber 110, visible in FIG. 3. Portions of contact layer 150 may be utilized as pixel data contacts 154 and fiber select contact 152. Note that data contact 154 on top electrode 140, visible in FIGS. 2B and 2C, lies completely in the space 126 between adjacent ITO electrodes 122. Also note that hole injection electrode 140, visible in FIG. 3, is of substantially the same width as is OLED layer 130.

Light emitted by light-emitting element 180 passes through optical fiber 110 to be observed by a viewer of the display including light-emitting fiber 100, as is indicated by arrow 105. While the light is generated in OLED material 130, it passes through the ITO or other thin material of electrode 120 in the direction indicated by arrow 105. The presence of top electrode 140 and/or contact layer 150 overlying OLED layer 130 desirably reflects light from OLED material 130 and so tends to increase the light output along the direction of arrow 105.

Where, for example, optical fiber 110 is about 0.25 mm (about 0.010 inch)wide, electrical bus 160 may overlie ITO electrode 122 by about 25 $\mu$m (about 0.001 inch) and insulator 170 may overlie bus 160 and ITO electrode 122 by about 50 $\mu$m (about 0.002 inch) along each side 114, 116 of fiber 110. Each OLED segment 130 may overlie insulators 170, 172 by about 25 $\mu$m (about 0.001 inch) and extends beyond the ends of ITO segment 122 by about 50 $\mu$m (about 0.002 inch). Metal top electrode 150 extends to the sides 114, 116 of optical fiber 110 and extends beyond the ends of each OLED segment 130 and top electrode 140 by at least about 25 $\mu$m (about 0.001 inch). Metal electrode 150 thus seals the OLED segments 130 and serves as a passivating layer or moisture barrier therefor.

Where light-emitting fiber 100 is utilized in a color display, light-emitting elements 180 emitting three different colors of light, such as red (R), green (G) and blue (B), are utilized. The three different color light-emitting elements 180R, 180G, 180B are arranged to be in adjacent sets of R, G, B elements, each set providing a color pixel. Such arrangement of light-emitting elements 180R, 180G, 180B may be provided by sequencing R, G and B OLED materials 130 along the length of each light-emitting fiber 100 or may be provided by placing fibers 100 of different colors side-by-side in an R-G-B sequence, i.e. a red-emitting fiber 100R next to a green-emitting fiber 100G next to a blue-emitting fiber 100B and so forth. Red-emitting fiber 100R, green-emitting fiber 100G, and blue-emitting fiber 100B may be fabricated on ribbons or fibers 100 that are each tinted to the desired color or may employ different light-emitting materials that respectively emit the desired color.

Suitable small molecule OLED structures are known and include ITO as the hole injector, green-emitting OLED fabricated from naththyl-substituted benzidine derivative (NPB) as the hole transport layer, tris-(8-hydroxyquinoline) aluminum ($Alq_3$) as the electron transport layer, and magnesium/silver as the cathode, which are available commercially from Aldrich Chemical Company located in Milwaukee, Wis. and are reported by E. W. Forsythe et al in Extended Abstracts of The Fourth International Conference on the Science and Technology of Display Phosphors & 9th International Workshop on Inorganic and Organic Electroluminescence, Sep. 14–17, 1998, at page 53.

Red emission is obtained by doping the $Alq_3$ layer in the foregoing OLED structure doped with 6% 2,3,7,8,12,13,17, 18-octaethyl-21H,23H-porphine platinum (II) (PtOEP) as reported by D. F. O'Brien et al in the Extended Abstracts of The Fourth International Conference on the Science and Technology of Display Phosphors & 9th International Workshop on Inorganic and Organic Electroluminescence, Sep. 14–17, 1998, at page 37 et seq. Blue emission is obtained in the foregoing OLED structure by including an additional layer. This OLED structure includes spiro-linked TAD (spiro-TAD) as the hole transport layer, spiro-linked sexiphenyl (spiro-6Φ) as the blue emitter layer, and $Alq_3$ as the electron transport layer as reported by Frank Weissortel et al in Extended Abstracts of The Fourth International Conference on the Science and Technology of Display Phosphors & 9th International Workshop on Inorganic and Organic Electroluminescence, Sep. 14–17, 1998, at page 5 et seq.

Small-molecule OLED materials may be applied by evaporation and polymer OLED materials may be deposited as monomers, for example, using ink jet printing, roller coating, screen printing and the like to deposit mixtures of the OLED material and suitable solvents as is known, and subsequently evaporating the solvent(s) and polymerizing the monomer by heating.

For a polymer OLED structure, ITO may be employed as the hole injector layer and polyethylene dioxythipene, commonly known as PEDOT, doped with polystyrene sulfonic acid (PEDOT:SS) available from by Bayer A.G. located in Ludwigshafen, Germany, or PVK poly-N-carbazole available from Aldrich Chemicals, as the hole transport layer. The electron transport/emissive layer can by a poly(fluorene)-based polymer for green emission, and other polymers for red and blue emission, as reported by J. H. Burroughes in the Extended Abstracts of The Fourth International Conference on the Science and Technology of Display Phosphors & 9th International Workshop on Inorganic and Organic Electroluminescence, Sep. 14–17, 1998, at page 133 et seq.

Such green-emitting OLED materials typically provide brightness levels of about 100 cd/m$^2$ and exhibit power efficiencies of about 1, 11 and 5 lumens/watt for the R, G and B materials, respectively.

Figure 4:
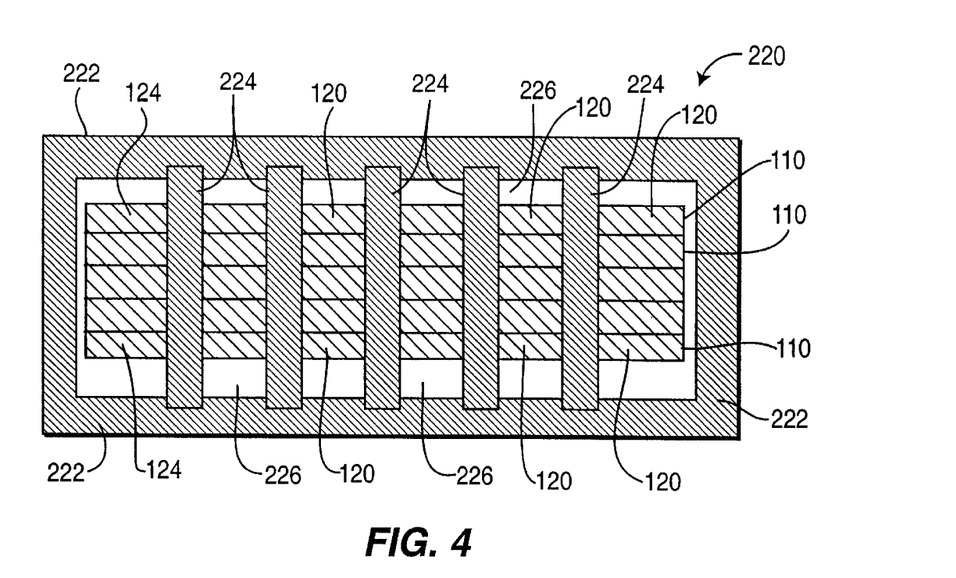
FIGS. 4, 5 and 7 are schematic diagrams of exemplary masking arrangements useful in fabricating plural exemplary light emitting fibers.
Figure 5:
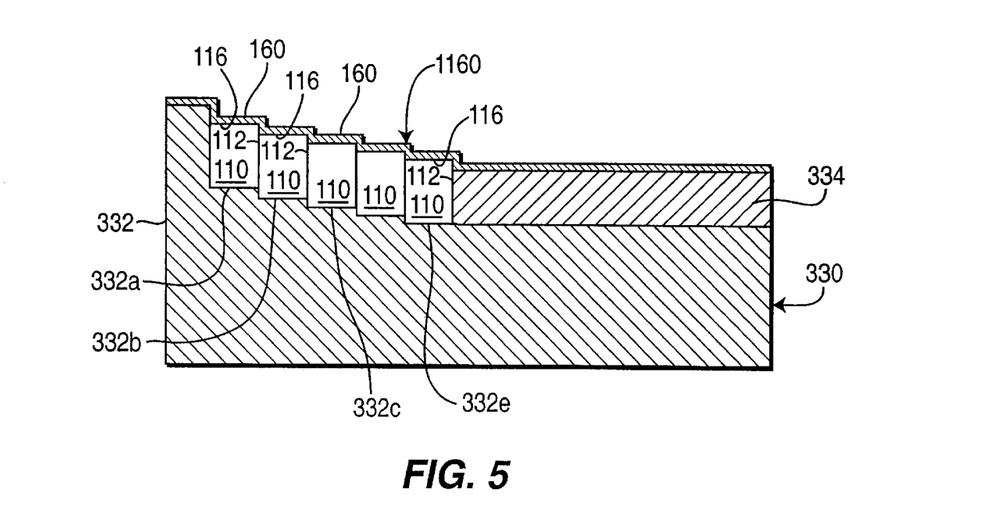
Figure 7:
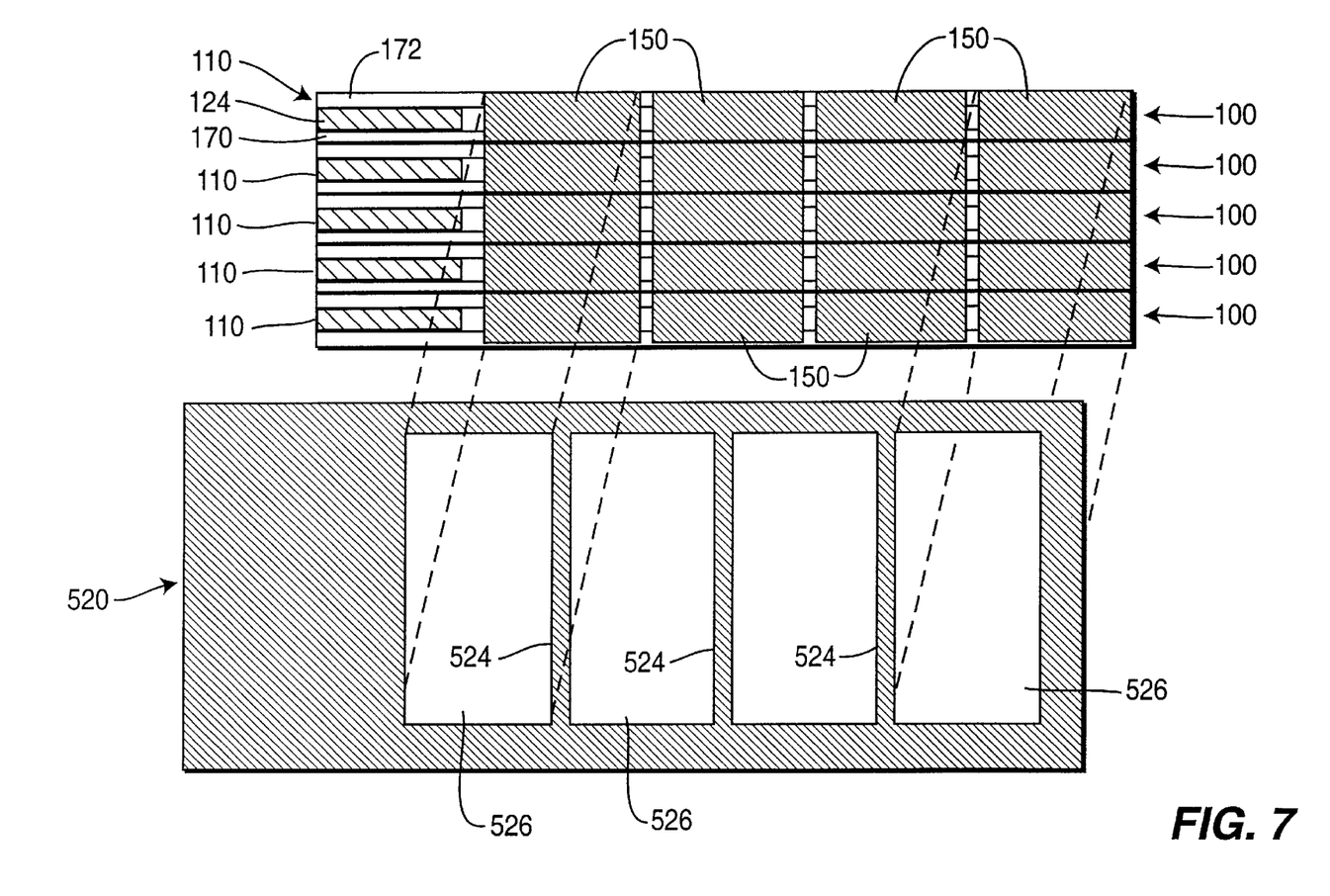

FIGS. 4, 5 and 7 are schematic diagrams of exemplary masking arrangements useful in contemporaneously fabricating plural exemplary light emitting fibers 100. Mechanical mask 220 shown in FIG. 4 has a peripheral masking portion 222 and transverse bridging masking portions 224 bridging between opposite edges of mask 220 to define plural mask openings 226 through which conductive material such as ITO forming hole injecting electrodes 122 is deposited on a plurality of optical fibers 110 that are arranged in side-by-side touching relationship, as illustrated. Bridging mask portions 224 extend in a direction transverse to the long dimension of optical fibers 110. Bridging mask portions 224 block areas of each of optical fibers 110 on which ITO is not deposited, thereby to define the spaces 126 between adjacent hole injecting electrode segments 122. ITO may be deposited by any convenient method, such as by sputtering or evaporation. For example, on an optical fiber of about 0.25 mm (about 0.010 inch) width, mask openings 226 may be about 0.50 mm (about 0.020 inch) long in the direction along the length of optical fibers 110 and on a pitch of about 0.75 mm (about 0.030 inch), thereby to define light-emitting areas that are about 0.25 by 0.50 mm (about 0.010 by 0.020 inch). Three such light-emitting areas provide a complete full-color pixel for a color display, which pixel is a square about 0.75 by 0.75 mm (about 0.030 by 0.030 inch).

Masking frame 330 shown in FIG. 5 has a series of steps 332a, 332b, . . . , 332e for receiving plural fiber substrates 110 of an optical material (also referred to as optical fibers or ribbons) for contemporaneously depositing metal electrical bus 160 on the respective sides 116 thereof. Each step 332a, 332b, . . . differs in elevation from the adjacent step 332b, 332c, . . . by the dimension of the overlap desired for electrical bus 160 on the top 112 of fiber substrates 110, and the width of each step 332a, 332b, . . . is the same as the top 112 to bottom dimension of fiber substrates 110. Plural fiber substrates 110 with segmented electrodes 122, 124 thereon are arranged on masking frame 330 as illustrated with their respective tops 112 facing to the right and with their respective side 114 against masking frame 330, and are clamped in position by clamp member 334. The aluminum, copper, gold or other metal for electrical bus 160 is deposited as a layer 1160, such as by evaporation or sputtering, on the side surfaces 116 and a portion of the top surfaces 112 of each of optical fiber substrates 110, thereby to connect to the segmented ITO electrodes 122, 124 on top surface 112 thereof.

The arrangement of masking frame 330 is likewise suited for depositing insulator 170 contemporaneously on the sides 116 of a plurality of optical fiber substrates 110 subsequent to the deposition of electrical bus 160 thereon, and for depositing insulator 172 contemporaneously on the sides 114 of a plurality of optical fibers 110. For such use, the elevation dimension difference between adjacent ones of the steps 332a, 332b, . . . is the same as the dimension of the overlap of the insulator 170, 172 on the tops 112 of optical fibers 110. Insulators 170, 172 also desirable slightly overlap of the edges of ITO electrodes 122 along the sides 114, 116 of optical fibers 110.

Figure 6:
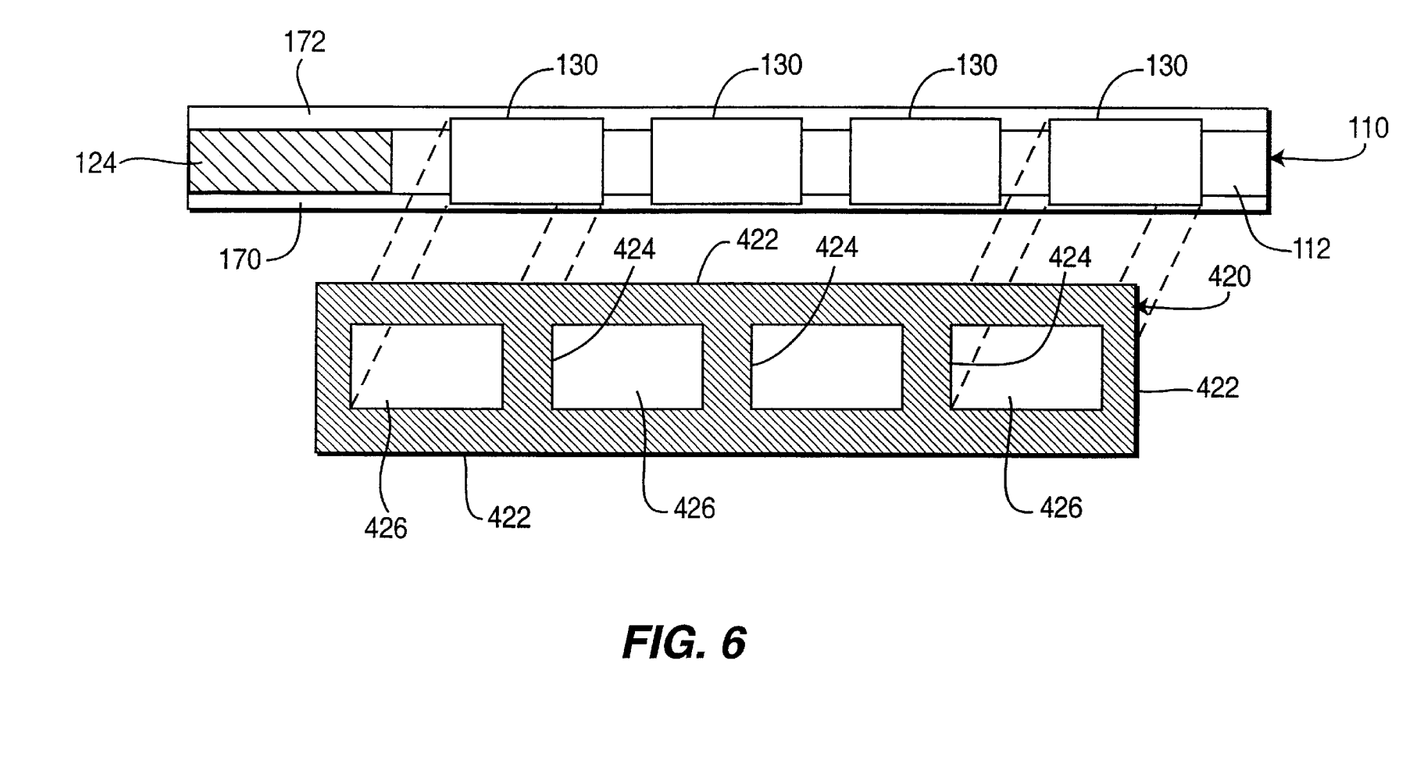
FIG. 6 is a schematic diagram of an exemplary masking arrangement useful in fabricating an exemplary light emitting fiber.

FIG. 6 is a schematic diagram of an exemplary masking arrangement 420 useful in fabricating an exemplary light emitting fiber 100. Mechanical mask 420 has a peripheral masking portion 422 and transverse bridging masking portions 424 bridging between opposite edges of mask 420 to define plural mask openings 426 through which light-emitting material such as OLED material forming light-emitting OLED elements 180 are deposited on an optical fiber 110, as illustrated. Bridging mask portions 424 extend in a direction transverse to the long dimension of optical fiber 110. Bridging mask portions 424 block areas of optical fibers 110 on which OLED material is not deposited and define openings 226 defining the areas on optical fiber 110 on which OLED material is deposited, thereby to define the size and shape of OLED areas 130 and of the light-emitting element 180 and the position thereof along the length of fiber 110. The layer of OLED material may be deposited by any convenient method, such as by evaporation. For example, on an optical fiber of about 0.25 mm (about 0.010 inch) width, mask openings 426 may be about 0.020 mm (about 0.008 inch) wide and about 0.50 mm (about 0.020 inch) long in the direction along the length of optical fibers 110 and on a pitch of about 0.75 mm (about 0.030 inch), thereby to define light-emitting elements (pixel elements) 180 that are about 0.20 by 0.50 mm (about 0.008 by 0.020 inch). The electron injecting electrodes 140 are deposited by a mask of the same size and shape as OLED mask 420 and placed in the same registration with optical fiber as is OLED mask 420.

It is important, if not critical, that the area of OLED layer segments 130 and of electron injecting electrodes 140 thereon be registered and positioned by mask 420 spaced away from both sides 114, 116 of optical fiber 110 in order to leave a thin strip, e.g., about 25 μm (about 0.001 inch) wide, along the edges thereof where passivation material is deposited to envelope OLED material 130 to provide a moisture barrier therefor. A mask for depositing passivation material may be of like size and shape to that of mask 420 and similarly registered with respect to optical fiber 110 and OLED elements 130 and electrodes 140 thereon, but with openings 426 extending beyond OLED elements 130 by about 25 μm (about 0.001 inch) on each side. Such passivation material may be a separate deposition or may be provided by the layer 150 of contact material.

FIG. 7 is a mechanical mask 520 of similar shape and size to mask 220 of FIG. 4 but differently dimensioned for defining the shape and size of contacts 150 on light-emitting fiber 100. Mechanical mask 520 has a peripheral masking portion 522 and transverse bridging masking portions 524 bridging between opposite edges of mask 520 to define plural mask openings 526 through which conductive metal contact material such as aluminum, copper, gold or other suitable metal is deposited for forming contacts 150 on a plurality of optical fibers 110 that are arranged in side-by-side touching relationship, as illustrated. Bridging mask portions 524 extend in a direction transverse to the long dimension of optical fibers 110. Bridging mask portions 524 block areas of each of optical fibers 110 on which metal contact material is not deposited, thereby to define the spaces between adjacent electrical contact segments 150. Contact metal may be deposited by any convenient method, such as by sputtering or evaporation. For example, on an optical fiber of about 0.25 mm (about 0.010 inch) width, mask bridging portions 524 may be about 125 μm (about 0.005 inch) long in the direction along the length of optical fibers 110 and on a pitch of about 0.75 mm (about 0.030 inch), thereby to define contact segments 150 that are about 0.25 by 0.625 mm (about 0.010 by 0.025 inch).

Figures 8A, 8B, 8C, 9:
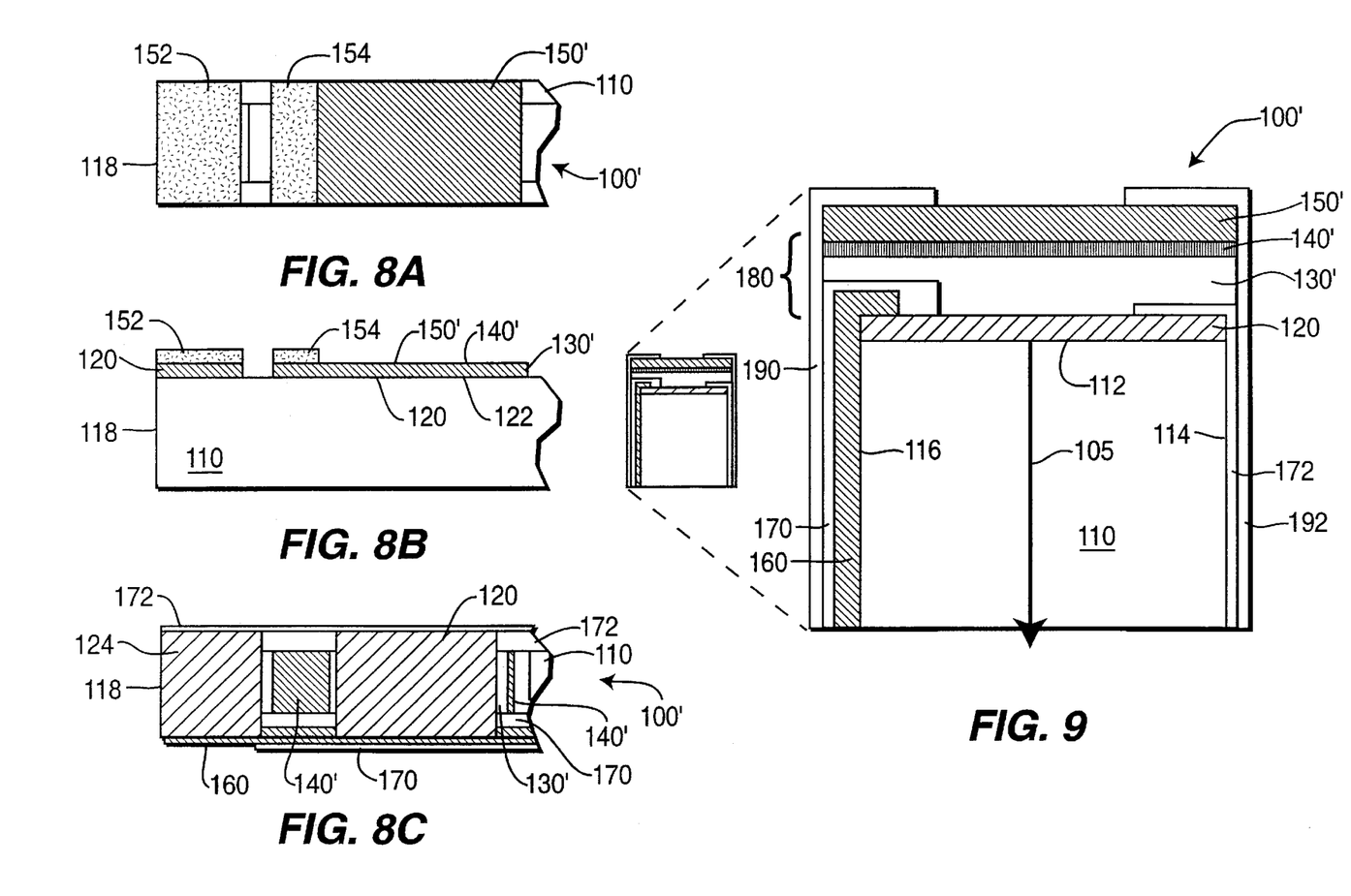
FIGS. 8A, 8B and 8C are schematic diagrams of a top view, side view and bottom view, respectively, of a portion of an alternative exemplary light emitting fiber.
FIG. 9 is a schematic cross-sectional diagram of the alternative exemplary light emitting fiber portion of FIGS. 8A–8C.

FIGS. 8A, 8B and 8C are schematic diagrams of a top view, side view and bottom view, respectively, of an alternative exemplary light emitting fiber 100' and FIG. 9 is a schematic cross-sectional diagram thereof. Light-emitting fiber 100' has the advantage of not requiring the precise masking and mask registration of the deposition of OLED material 130 and top electrode 140 as described above in relation to FIG. 6. Light-emitting fiber 100' includes OLED layer 130' that is deposited over substantially the full width of optical fiber 110, overlying segmented ITO electrodes 122, 124, electrical bus 160, and insulator layers 170, 172 as described above in relation to light-emitting fiber 100. Thus, segmented OLED layer 130,' segmented electron injecting electrodes 140' and segmented contact layer 150' are each deposited on a plurality of side-by-side optical fibers 110 contemporaneously with simple masks similar to those illustrated in FIGS. 4 and 7 that do not require precise transverse alignment.

After OLED layers 130', top electrode 140' and contact layer 150' are deposited, then insulators 190, 192 are deposited on sides 116, 114, respectively, of optical fiber 110, each of insulators 190, 192 being formed in like manner to that described above for insulators 170, 172, such as by utilizing the simple stepped mask and process as illustrated in FIG. 5 and described above. Insulators 190, 192 in cooperation with top electrode 140' and contact layer 150' passivate or provide a moisture seal for the edges and top, respectively, of OLED material 130'.

Figure 10:
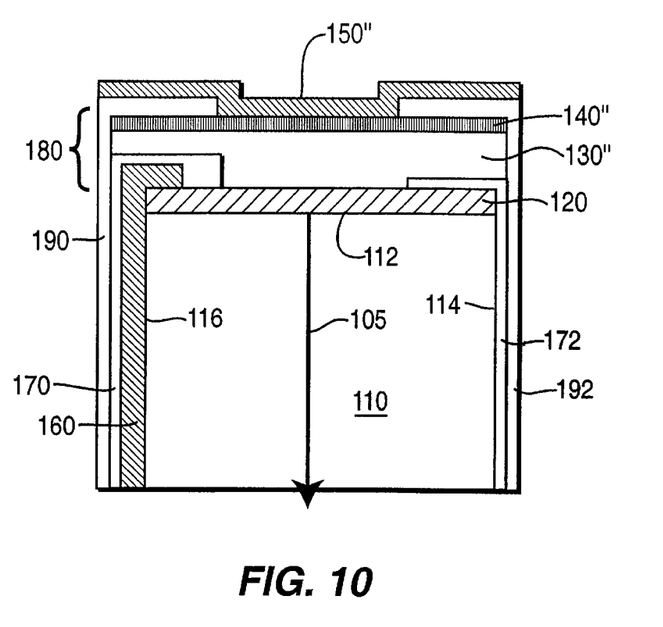
FIG. 10 is a schematic cross-sectional diagram of a further alternative exemplary light emitting fiber portion.

FIG. 10 is a schematic cross-sectional diagram of a further alternative exemplary light emitting fiber 100" which is similar to light-emitting fiber 100' described above up to and through the deposition of top electron injecting electrode 140'. Insulators 190, 192 are deposited as described above, but following the deposition of top electrode 140 and before the deposition of a contact material thereon. Insulators 190, 192 thus passivate the edges of OLED layer 130 as above. Metal contact electrode 150" is then deposited over top electrode 140' and the overlap portions of insulators 190, 192 over the top 112 of optical fiber 110 to passivate or seal OLED layer 130' and top electrode 140'.

Note that the method for making the light-emitting fibers 100', 100" of FIGS. 8A–8C, 9 and 10 do not require any mask that must be transversely aligned or registered with respect to optical fiber 110, and that all steps in the method may be practiced so as to process a plurality of optical fibers 110 contemporaneously, thereby substantially increasing production and correspondingly reducing the cost of each light-emitting fiber 100', 100".

Figure 11:
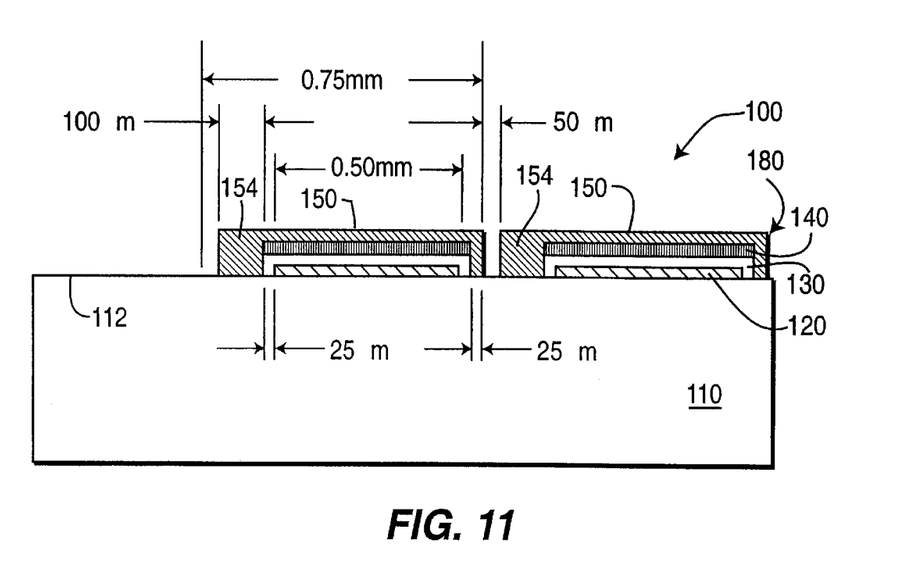
FIG. 11 is a side view schematic diagram illustrating exemplary dimensions of an exemplary light emitting fiber portion.

FIG. 11 is a side view schematic diagram illustrating exemplary dimensions of a portion of an exemplary light emitting fiber 100. For example, in a high-definition television (HDTV)display having a screen diagonal measurement of about 175 cm (about 66 inches) and a 16:9 aspect ratio, the image includes 1920×1080 full color pixels and each full color pixel includes three monochrome (red, green and blue) pixels. While transverse alignment and registration of deposition masks is not required, other than placing linear masks against the side of the optical fiber 110, longitudinal registration of the OLED elements 120, 130, 140 is required so that the OLED material 130 overlies the hole injecting ITO electrode 120 and that electron injecting electrode 140 overlies OLED material 130. But such longitudinal registration can be rather coarse given the relative large about 0.75 mm (about 0.030 inch) pitch of the light-emitting elements 180.

Typical dimensions for an about 0.25 mm (about 10 mil) wide optical fiber 110 include: about 0.50×0.25 mm (about 0.020×0.010 inch) pixels on an about 0.75 mm (about 0.030 inch) pitch, and having a contact layer of about 0.70×0.25 mm (about 0.028×0.010 inch) thereover. This allows a spacing of about 50 μm (about 0.002 inch) between adjacent contact layers 150 and a contact 154 area of about 0.1×0.25 mm (about 0.004×0.010 inch) at one end of contact layer 150. It also allows OLED layer 130 and top electrode 140 to overlap ITO electrode 120 by about 25 μm (0.001 inch) at each end. It is again noted that it is desirable that the contact 154 not overlie OLED layer 130 which is the active area of light-emitting element 180 so that OLED layer 130 is not damaged when connection is made to contact 154, such as by probe for testing or by attachment to an external conductor by compression, solder or electrically conductive epoxy.

While the present invention has been described in terms of the foregoing exemplary embodiments, variations within the scope and spirit of the present invention as defined by the claims following will be apparent to those skilled in the art. For example, other materials and dimensions may be utilized is making the light-emitting fibers according to the invention. The masks described herein may be of any convenient length and desirably are of a length for deposition of the various materials to be made contemporaneously along the entire length on an optical fiber. In addition, the masks may be of any convenient width for contemporaneously processing a desired number of optical fibers. Further, rotatable cylindrical masks may be utilized where it is desired to process an optical fiber of very long length using an in-line continuous process.

What is claimed is:

1. A light-emitting fiber comprising:

a length of a fiber of an optically transparent material;

a first electrode including a plurality of electrode segments disposed along the length of a first surface of said fiber, wherein said electrode segments include a layer of an optically-transparent electrically conductive material;

an elongated electrical conductor disposed along the length of said fiber on a second surface thereof that is contiguous to the first surface thereof, wherein said elongated electrical conductor is in electrical contact with each of said electrode segments along the length of said fiber;

a light-emitting material disposed on said plurality of electrode segments; and a plurality of electrical contacts disposed in one-to-one relation to said electrode segments)on the light-emitting material along the length of said fiber, wherein the light-emitting material disposed between a given one of said electrode segments and a corresponding one of said electrical contacts emits light responsive to an electrical signal applied between said elongated electrical conductor and said corresponding one electrical contact.

2. The light-emitting fiber of claim 1 wherein the optically-transparent material includes at least one of glass, borosilicate glass, soda-lime glass, quartz, sapphire, plastic, polymethyl-methacrylate (PMMA), polycarbonate, acrylic, Mylar, polyester, and polyimide.

3. The light-emitting fiber of claim 1 wherein the optically-transparent electrically conductive material includes at least one of indium tin oxide, tin oxide, zinc oxide, and combinations thereof.

4. The light-emitting fiber of claim 1 wherein said light-emitting material includes one of an inorganic electro-luminescent material and an organic light-emitting material.

5. The light-emitting fiber of claim 1 wherein at least one of said elongated electrical conductor and said electrical contacts includes at least one of aluminum, gold, silver, copper, chromium, alloys thereof, and combinations thereof.

6. The light-emitting fiber of claim 1 wherein said plurality of electrical contacts includes at least one layer of at least one of magnesium, magnesium/silver, calcium, calcium/aluminum, lithium fluoride and lithium fluoride/aluminum.

7. The light-emitting fiber of claim 1 wherein portions of said light-emitting material not covered by said plurality of electrical contacts is covered with a layer of moisture resistant material.

8. The light-emitting fiber of claim 7 wherein said moisture resistant material includes at least one of silicon nitride, silicon dioxide, silicon oxynitride, silicon carbide, diamond-like carbon, and phosphorus-silicate glass.

9. The light-emitting fiber of claim 1 wherein each of said plurality of electrical contacts includes a portion that extends beyond the given electrode segment with which that electrical contact corresponds to overlie a space between adjacent ones of said electrode segments, the extending portion of said electrical contact being adapted for receiving an electrical connection.

10. The light-emitting fiber of claim 1 wherein the electrode segment closest to a first end of said length of fiber and the electrical contact overlying that electrode segment are in direct electrical contact without intervening light-emitting material.

11. A fiber having a plurality of light-emitting elements disposed along its length, comprising:
  a length of a fiber of an optically transparent material;
  a plurality of light-emitting elements on a first surface of said fiber; and
  an elongated electrical conductor disposed along the length of said fiber on a second surface thereof that is contiguous to the first surface thereof, said elongated electrical conductor being adapted for receiving a first electrical signal;
  said plurality of light-emitting elements including:
    a plurality of first electrode segments disposed on the first surface along the length of said fiber, wherein each first electrode segment includes a layer of an optically-transparent electrically conductive material electrically connected to said elongated electrical conductor, whereby said elongated electrical conductor provides a first electrode connection common to all said light-emitting elements,
    a light-emitting material disposed on the first surface of said fiber on each of said first electrode segments to provide light-emitting material for each of said light-emitting elements,
    a plurality of second electrode segments disposed along the length of said fiber on the light-emitting material in one-to-one correspondence with said first electrode segments, each of said plurality of second electrode segments defining a second electrode of one of said plurality of light-emitting elements, and
    a plurality of electrical contacts disposed along the length of said fiber on the second electrode segments in one-to-one correspondence with said second electrode segments, each of said plurality of electrical contacts being adapted for receiving a second electrical signal,
  whereby the light-emitting material disposed between corresponding ones of said first and second electrode segments is adapted to emit light responsive to first and second electrical signals applied between said elongated electrical conductor and ones of said plurality of electrical contacts, respectively.

12. The fiber of claim 11 wherein the optically-transparent material includes at least one of glass, borosilicate glass, soda-lime glass, quartz, sapphire, plastic, polymethyl-methacrylate (PMMA), polycarbonate, acrylic, Mylar, polyester, and polyimide.

13. The fiber of claim 11 wherein the optically-transparent electrically conductive material includes at least one of indium tin oxide, tin oxide, zinc oxide, and combinations thereof.

14. The fiber of claim 11 wherein said elongated electrical conductor includes at least one of aluminum, gold, silver, copper, chromium, alloys thereof, and combinations thereof.

15. The fiber of claim 11 wherein said light-emitting material includes one of an inorganic electro-luminescent material and an organic light-emitting material.

16. The fiber of claim 11 wherein said plurality of second electrode segments includes at least one layer of at least one of magnesium, magnesium/silver, calcium, calcium/aluminum, lithium fluoride and lithium fluoride/aluminum.

17. The fiber of claim 11 wherein portions of said light-emitting material not covered by said second electrodes is covered with a layer of moisture resistant material.

18. The fiber of claim 17 wherein said moisture resistant material includes at least one of silicon nitride, silicon dioxide, silicon oxynitride, silicon carbide, diamond-like carbon, and phosphorus-silicate glass.

19. The fiber of claim 11 wherein each of said plurality of electrical contacts includes a portion that extends beyond the given first electrode segment with which that electrical contact corresponds to overlie a space between adjacent ones of said first electrode segments, the extending portion of said electrical contact being adapted for receiving an electrical connection.

20. The fiber of claim 11 wherein the first electrode segment closest to a first end of said length of fiber and the electrical contact overlying that first electrode segment are in direct electrical contact without intervening light-emitting material.

21. A fiber including a light-emitting element disposed thereon comprising;
  an optical fiber having a top surface and first and second side surfaces contiguous to the top surface;
  a first electrode of an optically transparent electrically conductive material on the top surface of said optical fiber and extending substantially the width of the top surface;

a layer of electrical conductor on the first side surface of said fiber including a portion extending onto the top surface thereof to connect to said first electrode;

a first layer of insulating material overlying at least the extending portion of said layer of electrical conductor and an edge portion of said first electrode proximal the second side of said optical fiber;

a layer of a light emitting material including one of an inorganic electro-luminescent material and an organic light-emitting material on said first electrode;

a second electrode of electrically conductive material on the layer of light emitting material;

an electrical contact of electrically conductive metal on the second electrode and having a portion extending beyond said layer of light-emitting material, the extending portion of said electrical contact being adapted for electrical connection; and a second layer of insulating material overlying at least any portion of said layer of light-emitting material not covered by one of said second electrode and said electrical contact, whereby no part of said light-emitting material is exposed.

22. The fiber of claim 21 wherein said layer of light-emitting material is spaced away from the edges where the first and second side surfaces of said optical fiber meet the top surface thereof, and wherein said electrical contact extends to said first layer of insulating material to enclose said light-emitting material.

23. The fiber of claim 21 wherein said layer of light-emitting material, said second electrode and said electrical contact all extend substantially the width of the top surface of said optical fiber, and wherein said second layer of insulating material extends from overlying at least part of the first and second side surfaces of said optical fiber to overlie at least parts of said electrical contact proximal the first and second side surfaces of said optical fiber, thereby to overlie edges of said layer of light-emitting material and of said second electrode.

24. The fiber of claim 21 wherein said layer of light-emitting material and said second electrode and said electrical contact both extend substantially the width of the top surface of said optical fiber, and wherein said second layer of insulating material extends from overlying at least part of the first and second side surfaces of said optical fiber to overlie at least parts of said second electrode proximal the first and second side surfaces of said optical fiber, thereby to overlie edges of said layer of light-emitting material and of said second electrode, and wherein said electrical contact overlies said second electrode and at least part of said second layer of insulating material that overlies the at least parts of said second electrode.

25. A method for making a light-emitting fiber having a plurality of light-emitting elements thereon comprising:

providing a length of optical fiber;

depositing a plurality of spaced-apart first electrode segments along the length of optical fiber;

depositing an electrical conductor along a side of the length of optical fiber and in electrical contact with the plurality of spaced-apart first electrode segments;

depositing a layer of a light-emitting material on the first electrode segments along the optical fiber; and depositing a plurality of electrical contacts on the light-emitting material and extending to overlie spaces between adjacent ones of the spaced-apart first electrode segments.

26. The method of claim 25 wherein said depositing a plurality of electrical contacts includes first depositing a plurality of spaced-apart second electrode segments on the layer of light-emitting material and substantially overlying the spaced-apart first electrode segments, and then depositing the plurality of electrical contacts on the plurality of second electrodes.

27. The method of claim 25 further comprising depositing at least one layer of insulating material to insulate the first spaced-apart electrode segments from the electrical contacts and to cover any of the layer of light-emitting material not covered by the plurality of electrical contacts.

28. The method of claim 25 wherein at least one of said depositing steps includes masking a plurality of lengths of optical fiber in side-by-side arrangement for contemporaneously depositing on each of the plurality of optical fibers.

29. A method for making a light-emitting fiber having a plurality of light-emitting elements thereon comprising:

providing a length of optical fiber;

depositing a plurality of spaced-apart first electrode segments along the length of optical fiber;

depositing an electrical conductor along a side of the length of optical fiber and in electrical contact with the plurality of spaced-apart first electrode segments;

depositing a layer of a light-emitting material on the first electrode segments along the optical fiber; and depositing a plurality of electrical contacts on the light-emitting material and extending to overlie spaces between adjacent ones of the spaced-apart first electrode segments, wherein said depositing an electrical conductor includes placing a plurality of lengths of optical fiber on a frame having a stepped shape, whereby at least one entire side of the optical fibers and a part of a second side contiguous the one entire side of the optical fibers is exposed, wherein said depositing an electrical conductor includes contemporaneously depositing on the plurality of optical fibers.

30. A method for making a light-emitting fiber having a plurality of light-emitting elements thereon comprising:

providing a length of optical fiber;

depositing a plurality of spaced-apart first electrode segments along the length of optical fiber;

depositing an electrical conductor along a side of the length of optical fiber and in electrical contact with the plurality of spaced-apart first electrode segments;

depositing a layer of a light-emitting material on the first electrode segments along the optical fiber;

depositing a plurality of electrical contacts on the light-emitting material and extending to overlie spaces between adjacent ones of the spaced-apart first electrode segments; and depositing at least one layer of insulating material to insulate the first spaced-apart electrode segments from the electrical contacts and to cover any of the layer of light-emitting material not covered by the plurality of electrical contacts, wherein said depositing at least one layer of insulating material includes placing a plurality of lengths of optical fiber on a frame having a stepped shape, whereby at least one entire side of the optical fibers and a part of a second side contiguous the one entire side of the optical fibers is exposed, and wherein said depositing at least one layer of insulating material includes contemporaneously depositing on the plurality of optical fibers.

* * * * *